May 28, 1963 R. L. SMYTHE 3,091,555
METHOD FOR FORMING LOW REFLECTANCE COATINGS OF CRITICAL THICKNESS ON SILICON SOLAR ENERGY CONVERTERS
Filed Sept. 8, 1960
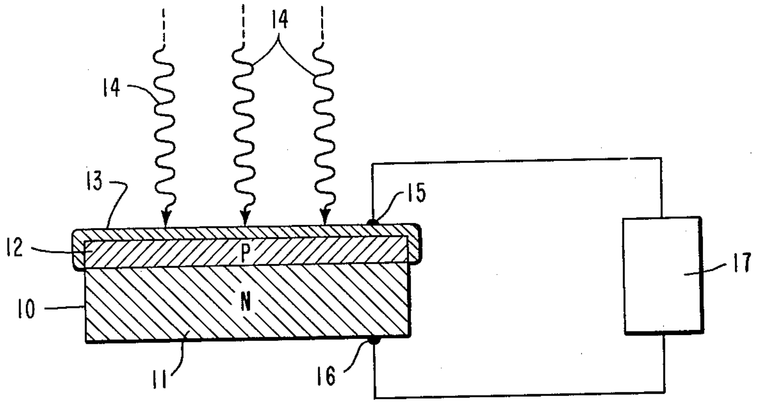
INVENTOR
Robert L. Smythe
BY Stevens, Davis, Miller & Mosher
ATTORNEYS United States Patent Office 3,091,555
Patented May 28, 1963

3,091,555

METHOD FOR FORMING LOW REFLECTANCE COATINGS OF CRITICAL THICKNESS ON SILICON SOLAR ENERGY CONVERTERS

Robert L. Smythe, Dallas, Tex., assignor to Texas Instruments Incorporated, Dallas, Tex., a corporation of Delaware Filed Sept. 8, 1960, Ser. No. 54,618
13 Claims. (Cl. 117—201)

This invention relates to the fabrication of silicon solar energy converters, and more particularly relates to a method for forming a low reflectance coating of a critical thickness on the P-type regions of a silicon solar cell to decrease the amount of light reflected from the surface of the solar cell.

The conversion of solar radiations into electrical energy by means of silicon P-N junction photocells is a comparatively recent development in the semiconductor art. Discussions of this type of solar energy converter have appeared in such articles as "A New Silicon P-N Junction Photocell for Converting Solar Radiation into Electrical Power," by Chapin, Fuller and Pearson, Journal of Applied Physics, vol. 25, page 676 (1954); "Use of Silicon P-N Junctions for Converting Solar Energy to Electrical Energy," by Cummerow, Physical Review, vol. 95, page 591 (1954); "Radioactive and Photoelectric P-N Junction Power Source," by W. O. Pfann and W. van Roosbroeck, Journal of Applied Physics, vol. 25, page 1422 (1954); "Silicon Solar Energy Converters," by Prince, Journal of Applied Physics, vol. 26, page 534 (1955).

Present solar energy converters consists of a very thin wafer of silicon which has an electron rich N-region and a hole rich P-region. In the silicon wafer, the N-type region is produced by donor impurities and, since the donor impurities in the lattice structure contribute an excess, or free electron, the impurity atoms in the N-type region have a net positive charge. Conversely, acceptor impurities produce the P-type region of the wafer, and in the lattice structure, require an electron to complete their valence bond with the silicon atoms. Consequently, the acceptor impurity atoms have a net negative charge. As a result of the positive charge on the donor atoms and the negative charge on the acceptor atoms, an electric field exists at the junction between the two regions which keeps electrons in the N-type region and holes in the P-type region. When light particles, hereinafter referred to as photons, are absorbed by the silicon crystal, hole-electron pairs are generated in the conduction band. The electric field existing in the wafer then forces the holes into the P-region and the electrons into the N-region, thereby making the P-region positive and the N-region negative. Displacement of these newly-freed charges causes a voltage between the crystal ends which will supply electrical energy to an external circuit.

The energy of the sun reaching the earth's surface is approximately eighty-five trillion kilowatts (85×1012 kw.) or, expressed differently, one thousand watts per square meter of the earth's surface. A silicon P-N junction solar cell of a unit area, however, is unable to convert all of the incident photons into electrical energy. One reason for this is that a relatively large number of the photons incident on an untreated semiconductor surface suffer reflection and are lost. This vastly limits the efficiency of the solar energy converter, as well as the amount of electrical energy obtainable from a single converter.

It has been found that by providing critical thickness coatings of silicon monoxide or silicon dioxide on the surfaces of the P-type region of a silicon P-N junction solar cell, the amount of light reflected by the cell can be substantially reduced. The necessary critical thickness is ¼ wavelength, and since silicon solar energy converters operate most efficiently for light having wavelengths in the range of 4000–11000 angstroms with a peak response at about 9000 angstroms, the oxide coatings should have an optical thickness of about 2000 angstroms. A silicon dioxide coating of this thickness has been found to reduce the reflectivity of a silicon solar cell, and increases efficiency by as much as 25% over uncoated cells, while a silicon monoxide coating of ¼ wavelength thickness in the wavelength range of interest results in a reduction in reflectivity and an increase in efficiency by as much as 35%.

A difficulty presently encountered in the manufacture of the coated silicon solar cells resides in forming the oxide coating on the silicon. One method which has been used is to place the silicon cell in an evacuated chamber near a tantalum boat containing pieces of silicon monoxide. The tantalum is heated to vaporize the silicon monoxide, causing it to deposit as a film on the desired regions of the silicon solar cell. This coating technique suffers from the drawback that a great deal of equipment is required, making the process involved, time consuming, and highly expensive. Moreover, it is very difficult to use the evaporation method when coating silicon cells of odd shapes, since different masks and cell mounting means have to be employed for each different photocell configuration. Even then it is difficult to obtain uniform coatings.

As a result of all the disadvantages inherent in coating by evaporation methods, an investigation was undertaken to determine if chemical methods could be used to form the critical thickness coatings on the surfaces of silicon solar cells instead of the involved and expensive evaporation techniques.

It is publicly known that if a body of silicon having a P-N junction is immersed in a solution of hydrofluoric acid, nitric acid and water, a silicon monoxide coating will form on the P-type surfaces of the silicon body. This method has been used to distinguish P-type silicon from N-type silicon and is discussed in U.S. Patent 2,740,700.

The present invention contemplates adapting the known general concept of immersing a silicon body in hydrofluoric acid, nitric acid and water, to produce a silicon monoxide coating on the P-type regions of the silicon body to the specific problem of forming a critical thickness low-reflectance coating on solar cells. In adapting this general concept, it was discovered that the concentration of nitric acid in the solution must be maintained within a narrow critical range and that the silicon solar cell must remain in the solution for a controlled time to ensure that a coating having a thickness of ¼ wavelength at about 9000 angstroms will result. When one is merely interested in distinguishing P-type silicon from N-type silicon, a solution containing anywhere from 0.1% to 11% nitric acid, 1.5% to 48.5% hydrofluoric acid, and 50.5% to 97% water may be used. A preferred solution for this purpose is disclosed in U.S. Patent 2,740,700 as containing 1.4% nitric acid, 25% hydrofluoric acid, and 73.6% water.

However, in order to form ¼ wavelength coatings on silicon solar cells, it is essential and critical that the concentrating of nitric acid be maintained at less than 0.5%, and preferably in the range of 0.1% to 0.4% by volume.

It is, therefore, a principal object of the present invention to provide a method for forming a low-reflectance coating of a critical thickness on the P-type surface of a silicon solar energy converter to allow more photons to interact with the semiconductor material and thus increase the efficiency of the solar cell. The method of this invention requires far less equipment than present coating methods; hence, it is considerably less expensive to carry out than present techniques. Moreover, the method may be readily and conveniently used to coat silicon semiconductor bodies of various geometry without any modification.

It is a further object of the present invention to provide a way of forming a silicon monoxide coating on P-type regions of silicon semiconductor material by immersing the silicon in a solution of hydrofluoric acid, nitric acid, and water to produce critical thickness ¼ wavelength coatings on silicon solar energy converters by maintaining a highly critical concentration of nitric acid in the solution and by allowing the silcon solar cells to reman in the solution for preselected times to ensure that coatings of the desired thickness will be produced.

Other and further objects, advantages, and characteristic features of the present invention will become readily apparent from the following detailed description of preferred embodiments of the invention when taken in conjunction with the sole figure, which illustrates a solar energy cell made in accordance with the principles of the present invention.

Referring now to the sole FIGURE, the solar energy converting device of this invention comprises a wafer 10 of silicon, having a body 11 of N-type material and a very thin layer 12 of P-type material, formed by solid state diffusing a suitable P-type impurity into the N-type material by conventional techniques. The wafer 10, for example, is around two centimeters long, one centimeter wide, and 20 mils thick. The resistivity of the silicon is preferably between 0.1 and 0.3 ohm-cm., with the P-type layer 12 having a surface concentration of essentially $2\times10^{21}$ impurity atoms per cc. and penetrating into the wafer to a depth of less than 0.1 mil. A coating 13 of an oxide of silicon is formed on the outer surfaces of the P-type layer 12 to reduce substantially the number of photons which are reflected from the P-layer surfaces from the number of photons which would be reflected if the coating 13 were not present. In a preferred embodiment of the present invention, the coating 13 is of silicon monoxide, although the silicon monoxide may be oxidized to silicon dioxide with only slight impairment of its low reflectivity characteristics. An essential criterion for the coating is that its index of refraction should equal the square root of the index of refraction of silicon.

The solar energy waves (indicated by the numeral 14 in the figure) impinge upon the wafer 10, and due to the low reflectance of the coating 13, most of the rays 14 are not reflected at the outer surfaces of the layer 12 but rather are allowed to interact with the semiconductor material. This interaction results in the formation of hole-electron pairs in the conduction band of the semiconductor material, causing a voltage to appear between a terminal 15 on the P-type material and a terminal 16 on the N-type layer. As is shown in the figure, this voltage may be applied across a suitable load 17 to cause current to flow through the load.

The method for forming the low reflectances coating 13 on the silicon wafer 10 is as follows. First, a wafer of silicon having an N-type layer and a much smaller P-type layer is produced by conventional techniques. Then, the wafer is immersed in a solution containing hydrofluoric acid, nitric acid and water. The concentration of the nitric acid is highly critical, and it is essential that the nitric acid be present in the solution in an amount less than 0.5% by volume. If larger percentages of nitric acid are present, it is impossible to form coatings of the proper ¼ wavelength thickness. Suitable percentages of nitric acid for a practical coating-producing solution range from 0.1% to 0.5% by volume. An example of a specific coating solution which has been successfully employed is from one to two parts of 70% $HNO_3$, 500 parts of 48.5% HF and from 0 to 250 parts of water.

The solution will attack only P-type silicon, and hence a layer of silicon monoxide is formed on the surfaces of the P-type material only, with the N-type material remaining intact. The speed at which the coating forms depends upon the relative amounts of nitric acid and water present in the solution, the greater the strength of the acid the more rapid the formation of the coating. Therefore, the speed of the formation of the silicon monoxide coating may be varied by changing either the amount of nitric acid present or by varying the amount of water used. Since the nitric acid is present in such small quantities and is so critical, it has been found more convenient to alter the percentage of water in the solution.

The coating operation initially is slow, i.e., it takes a long time for a coating of proper thickness to form on the first few solar cells immersed in the solution. However, experimental results indicate that the formation of the silicon monoxide coatings induce some sort of catalytic action in the solution, and the time required to produce a coating of the proper thickness is gradually reduced as more and more coatings are formed. If this catalytic action is allowed to build up, eventually the coatings would be formed so fast that coatings having thicknesses greater than ¼ wavelength would be produced before the solar cell could be removed from the solution. In order to prevent this increase in the speed of formation of the coatings, the solution is gradually diluted with water as more and more coatings are formed. Thus, the percentage (by volume) of water in the solution will gradually be increased as the operation of coating a batch of solar cells progresses.

Since silicon solar energy converters are most sensitive to wavelengths in the range of 4000–11000 angstroms, the silicon monoxide coatings are made of such a thickness as to transmit wavelengths in this range. In order for coatings of such a thickness to be formed, the wafers are allowed to remain in the coating solution for a time interval in the order of 10–20 minutes, depending on the particular thickness desired. A direct correlation exists between the thickness of the silicon monoxide coating and the color of the coating. Fore example, a coating with an optical thickness of 1750 angstroms exhibits a deep blue color, 2000 angstrom coatings are light blue, while coatings of intermediate thicknesses will exhibit various shades of blue. Coatings thicker than 2000 angstroms will exhibit colors other than blue. By carefully watching the color of the coatings, the coating thickness may be fairly accurately estimated. The silicon wafer may then be removed from the coating solution when a coating of the desired thickness has been achieved, as indicated by the color of the coating. Thus, the thickness of the coating is readily determined and uniformly controlled.

In an alternate embodiment of the present invention, the silicon monoxide coating is oxidized to silicon dioxide. This is accomplished by placing the coated silicon wafer in an oven containing an oxygen atmosphere and heating to a tempearture of above 600° C. The wafer is kep in the oven for a period of less than ten minutes, to give rapid conversion of SiO to $SiO_2$. The silicon monoxide coating is soft and unstable, whereas the silicon dioxide layer is hard and adherent.

The solar cell of the present invention, due to its low reflectivity coating, is able to convert more incident photons into electrical energy because much fewer photons are reflected, hence the device can operate at higher efficiencies. Moreover, the formation of the ¼ wavelength silicon monoxide or silicon dioxide coatings by immersing the silicon wafer in a critical nitric acid-hydrofluoric acid solution is a vast improvement over forming the coatings by evaporation or other techniques. This is because the adherence of the coating to the wafer is greater when the technique of this invention is practiced, and also because silicon wafers of any geometric shape may be coated by the method of the present invention, whereas according to other coating techniques, the specific geometry of the silicon wafer has to be taken into account.

In order to illustrate the specific manner in which the method of the present invention may be carried out, a description of a typical coating operation will now be given. This description contains a series of specific and detailed examples of the invention. A diffused junction silicon wafer of the type specifically described above was immersed in a solution consisting of two parts by volume of 70% nitric acid and 500 parts by volume of 48.5% hydrofluoric acid. A coating began to form on the silicon wafer and after the wafer had remained in the solution for nearly 20 minutes, the coating had become blue in color. The wafer was then removed from the solution, and a second diffused junction silicon wafer, the same as the first, was placed in the solution. A blue coating formed on this wafer in a slightly shorter time than before, and after the blue color was achieved, this second wafer was removed from the solution. Additional similar diffused junction silicon wafers were immersed in the solution, coated, and removed when the coatings became blue in color, the speed of the formation of the coating increasing with each wafer. Eventually the blue color was obtained in around 10 minutes. At this time 50 parts (by volume) of water were added to the solution, after which a similar diffused junction silicon wafer of the type described above was immersed in the diluted solution. The dilution of the solution reduced the speed of formation of the coating, and it now required nearly 20 minutes for the blue color to be achieved. After several additional immersions of similar silicon wafers, the blue coatings was once again produced in slightly over 10 minutes. At this time 50 additional parts (by volume) of water were added to the solution to bring the coating time back up to around 20 minutes. After several additional immersions of similar diffused silicon wafers, the time required for the formation of the blue coatings once again approached 10 minutes, at which time the solution was again diluted. The process was repeated until 250 parts (by volume) of water had been added to the solution and the coating time had decreased to 10 minutes, at which time the coating operation was stopped.

Although the present invention has been shown and described with reference to particular embodiments, nevertheless, various changes and modifications obvious to those skilled in the art are deemed to be within the spirit, scope, and contemplation of the invention. Thus, the method of the present invention could be utilized by forming low-reflectance coatings of silicon monoxide on the surface of any silicon product in which a low-reflectance coating is either desired or required so long as the surface exhibits P-type conductivity.

What is claimed is:

1. A method for treating a device for converting solar energy into electrical energy comprising immersing an element of silicon having a P-type layer and an N-type layer into a solution of nitric acid, hydrofluoric acid, and water, which solution contains less than about 0.5% nitric acid by volume, for a period of time according to color correlation sufficient to form a silicon monoxide coating having a thickness of ¼ wavelength for light within a preselected wavelength range on the surface of said P-type layer.

2. A method according to claim 1 wherein said solution contains from about 0.1% to about 0.5% nitric acid by volume.

3. A method according to claim 1 wherein said solution consists of essentially from about 1 to about 2 parts by volume of 70% nitric acid, about 500 parts by volume of 48.5% hydrofluoric acid and from 0 to about 250 parts by volume of water.

4. A method for forming a low-reflectance coating of silicon monoxide on a silicon device comprising immersing an element of silicon having a P-type surface layer in a solution of nitric acid, hydrofluoric acid, and water, which solution contains less than about 0.5% nitric acid by volume, for a preselected time according to color correlation sufficient to form a silicon monoxide coating having a thickness of ¼ wavelength for light within a preselected wavelength range on the surfaces of said P-type layer.

5. A method according to claim 4 wherein said preselected time is from about 10 to about 20 minutes.

6. A method according to claim 4 wherein said preselected wavelength range is about 9000 angstroms.

7. A method according to claim 4 wherein said solution contains from about 0.1% to about 0.5% nitric acid by volume.

8. A method according to claim 4 wherein said solution consists of essentially from about 1 to about 2 parts by volume of 70% nitric acid, about 500 parts by volume of 48.5% hydrofluoric acid and from 0 to about 250 parts by volume of water.

9. A method for forming low reflectance coatings of silicon monoxide on a plurality of devices for converting solar energy into electrical energy comprising immersing elements of silicon having a P-type layer and an N-type layer in a solution of nitric acid, hydrofluoric acid and water, which solution contains less than about 0.5% nitric acid by volume, for a period of time according to color correlation sufficient to form silicon monoxide coatings having thicknesses of ¼ wavelength for light within a preselected wavelength range on the surface of the P-type layers of said silicon elements and gradually adding water to said solution in order to prevent the speed at which the silicon monoxide coatings are formed from increasing substantially.

10. A method for treating a device for converting solar energy into electrical energy comprising immersing an element of silicon having a P-type layer and an N-type layer in a solution of nitric acid, hydrofluoric acid and water, which solution contains less than about 0.5% nitric acid by volume, for a period of time according to color correlation sufficient to form a silicon monoxide coating having a thickness of ¼ wavelength for light within a preselected wavelength range on the surfaces of said P-type layer, removing said silicon element from said solution, and heating said silicon element in an oxygen atmosphere to convert the silicon monoxide to silicon dioxide.

11. A method for forming a low reflectance coating of silicon dioxide on a device for converting solar energy into electrical energy comprising immersing an element of silicon having a P-type layer and an N-type layer in a solution of nitric acid, hydrofluoric acid, and water, which solution contains less than about 0.5% nitric acid by volume, for a period of time according to color correlation sufficient to form a silicon monoxide coating having a thicknes of ¼ wavelength for light within a preselected wavelength range on the surfaces of said P-type layer, removing said silicon element from said solution, and heating said silicon element in an oxygen atmosphere at a temperature above 600° C. for less than 10 minutes to oxidize the silicon monoxide to silicon dioxide.

12. A method for treating a device for converting solar energy into electrical energy comprising immersing an element of silicon having a P-type layer and an N-type layer in a solution of nitric acid, hydrofluoric acid and water, which solution contains less than 0.5% nitric acid by volume, and removing said element from said solution after a period of time sufficient to form a silicon monoxide coating having a thickness between 4,000 to 11,000 angstroms as signified by color correlation of ¼ wavelength for light at a preselected wavelength.

13. A method for treating a device for converting solar energy into electrical energy comprising immersing an element of silicon having a P-type layer and an N-type layer in a solution of nitric acid, hydrofluoric acid and water, which solution contains less than 0.5% nitric acid by volume, removing said element from said solution after a period of time sufficient to form a silicon monoxide coating having a thickness between 4,000 to 11,000 angstroms as signified by color correlation of ¼ wavelength for light at a preselected wavelength, and heating said silicon element in an oxygen atmosphere to convert the silicon monoxide to silicon dioxide.

References Cited in the file of this patent

UNITED STATES PATENTS 2,740,700 Fuller ---------------- Apr. 3, 1956

FOREIGN PATENTS 1,066,395 Germany -------------- Oct. 1, 1959